(12) United States Patent
Oka et al.

(10) Patent No.: US 8,034,531 B2
(45) Date of Patent: Oct. 11, 2011

(54) PHOTOSENSITIVE RESIN COMPOSITION COMPRISING A HALOGEN-FREE COLORANT

(75) Inventors: Hidetaka Oka, Takarazuka (JP); Jean-Marie Adam, Rosenau (FR)

(73) Assignee: BASF SE, Ludwigshafen (DE)

( * ) Notice: Subject to any disclaimer, the term of this patent is extended or adjusted under 35 U.S.C. 154(b) by 817 days.

(21) Appl. No.: 10/535,373

(22) PCT Filed: Nov. 19, 2003

(86) PCT No.: PCT/EP03/50849
§ 371 (c)(1),
(2), (4) Date: May 19, 2005

(87) PCT Pub. No.: WO2004/049070
PCT Pub. Date: Jun. 10, 2004

(65) Prior Publication Data
US 2005/0282923 A1    Dec. 22, 2005

(30) Foreign Application Priority Data
Nov. 28, 2002 (EP) .................... 02406035

(51) Int. Cl.
*G03C 1/00* (2006.01)
*C09B 47/04* (2006.01)
*C09B 62/00* (2006.01)
*C09B 67/00* (2006.01)

(52) U.S. Cl. .................... 430/270.1; 540/122; 540/135; 540/139

(58) Field of Classification Search ............... 430/270.1, 430/945; 540/122, 135, 139
See application file for complete search history.

(56) References Cited

U.S. PATENT DOCUMENTS

| | | | |
|---|---|---|---|
| 4,039,585 A * | 8/1977 | Homeier .................... 568/455 |
| 4,789,620 A * | 12/1988 | Sasaki et al. ............... 430/280.1 |
| 5,009,982 A | 4/1991 | Kamayachi et al. ............... 7/31 |
| 5,594,128 A | 1/1997 | Wolleb .................... 47/4 |
| 5,691,101 A * | 11/1997 | Ushirogouchi et al. ....... 430/176 |
| 5,789,137 A | 8/1998 | Itoh et al. .................... 7/27 |
| 5,854,323 A * | 12/1998 | Itabashi et al. ................ 524/88 |
| 6,043,355 A | 3/2000 | Yashiro et al. |
| 6,051,360 A * | 4/2000 | Karasawa et al. ........... 430/270.1 |
| 6,087,492 A * | 7/2000 | Wolleb ........................ 540/139 |
| 6,197,472 B1 * | 3/2001 | Konrad et al. ................. 430/157 |
| 6,444,807 B1 * | 9/2002 | Wolleb et al. ................. 540/131 |
| 6,533,860 B1 | 3/2003 | Hatakeyama et al. |
| 6,661,770 B2 * | 12/2003 | Kakuta et al. ............... 369/275.4 |
| 6,726,755 B2 * | 4/2004 | Titterington et al. ........ 106/31.29 |
| 7,144,677 B2 * | 12/2006 | Yashiro .................... 430/270.16 |
| 2002/0025402 A1* | 2/2002 | Tronche et al. ................. 428/64.4 |
| 2002/0077384 A1* | 6/2002 | Sano et al. .................... 523/160 |
| 2002/0136986 A1 | 9/2002 | Chang et al. .................... 7/27 |

FOREIGN PATENT DOCUMENTS

| | | |
|---|---|---|
| JP | 9-279050 A | 10/1997 |
| JP | 11-049773 A | 2/1999 |
| JP | 2000-007974 A | 1/2000 |
| JP | 2001-064534 A | 3/2001 |
| JP | 2002309119 A * | 10/2002 |
| WO | 02-48794 A1 | 6/2002 |

OTHER PUBLICATIONS

Leznoff et al., "The Synthesis of 2,9,16,23- and 1,8,15,22-tetrahydroxyphthalocyanines." Canadian Journal of Chemistry, vol. 72, pp. 1990-1998, Mar. 31, 1994.* English language abstract of JP2000-007974 printed from the esp@cenet web site on Jul. 27, 2009.
English language abstract of WO 02/048794 printed from the esp@cenet web site on Jul. 27, 2009.
English language abstract of JP 9 -279050 printed from the esp@cenet web site on Jul. 7, 2009.

* cited by examiner

*Primary Examiner* — Cynthia Kelly
*Assistant Examiner* — Connie P Johnson
(74) *Attorney, Agent, or Firm* — Qi Zhuo

(57) ABSTRACT

The present invention relates to a photosensitive resin composition comprising a) as a component (A) a green colorant of the formula (I) in which the rings A, B, C and D are substituted by hydroxy or by moiety wherein R, is hydrogen or $C_1$-$C_4$-Alkyl, $R_2$ is hydrogen or $C_1$-$C_4$-Alkyl, n is 0, 1, 2 or 3 and the ring E is unsubstituted or substituted by $C_1$-$C_6$alkyl, $C_1$-$C_6$alkoxy, hydroxy, $NHCOR_3$, $NHSO_2$, $R_4$ or $SO_2NHR_5$, wherein $R_3$, is $C_1$-$C_4$,-Alkyl or phenyl, $R_4$, is $C_1$,-$C_4$-Alkyl or phenyl and $R_5$ is $C_1$,-$C_4$-Alkyl or phenyl, b) as a component (B) an alkali soluble oligomer or polymer (reactive or unreactive), c) as a component (C) a polymerizable monomer, d) as a component (D) a photoinitiator, e) as a component (E) an epoxy compound, and also, if desired, f) as a component (F) further additives, used as solder resist, etching resist or plating resist in the manufacture of printed circuit boards.

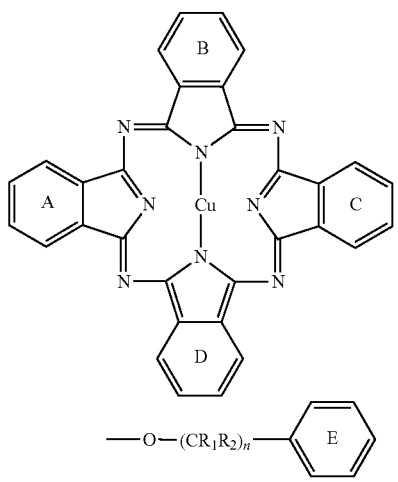

(I)

5 Claims, No Drawings

PHOTOSENSITIVE RESIN COMPOSITION COMPRISING A HALOGEN-FREE COLORANT

This invention concerns photosensitive resin composition comprising a halogen-free colorant More particularly, the invention relates to a photosensitive resin composition comprising a halogen-free colorant having high sensibility and capable of exhibiting excellent heat resistance and adhesion to the substrate surface when used as solder resist, etching resist or plating resist in the manufacture of printed circuit boards.

The general concept of the use of resist coating is well known, especially in the electronics industry.

U.S. Pat. No. 5,009,982 discloses solder resist which uses phthalocyanine green (halogenated phthalocyanine), Pigment Green 7 and Pigment Green 36, as a green colorant. But recently resist maker have tried to reduce the halogen content from the resist formulation due to the current ecological movement. Therefore the lower halogen content is also asked for the colorant.

One solution is to use phthalocyanine blue that was mentioned in U.S. Pat. No. 5,009,982. Phthalocyanine without halogen substitution shows blue color, therefore, such blue pigment was tried to use for solder resist. But blue color was not well accepted by resist users.

The other solution is to generate green color by mixing non-halogen blue and non-halogen yellow. This idea is described in JP-A-2000-7974 and in JP-A-2001-64534.

JP-A-2000-7974 discloses a composition of solder resist comprising non-halogen blue and non-halogen yellow. The used composition uses very typical ingredients for solder resist except pigment.

JP-A-2001-64534 is a composition patent of green pigment. The main argument is how to prepare green by blue and yellow. One is co-kneading method, and the other is dissolving blue and yellow in strong acid then pouring it into water for reprecipitation. Application area of such green pigment composition is widely mentioned.

A solder resist comprising a single green pigment that maintains qualities required as a green coloring material, such as clear hue, good weather- and heat resistance and that is satisfactory at the same time in the points of environmental pollution, has not been found yet in the present state of the art.

There is therefore a need for such photosensitive resin composition comprising a single halogen-free colorant.

It has now been found, surprisingly, that the photosensitive resin composition according to the invention meet the criteria given above to a considerable degree.

The present invention accordingly relates to a photosensitive resin composition comprising a) as a component (A) a green colorant of the formula

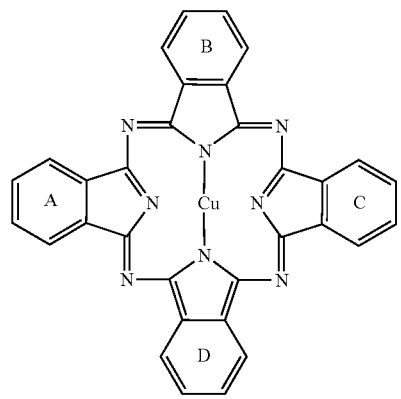

(I)

in which the rings A, B, C and D are substituted by hydroxy or by the moiety

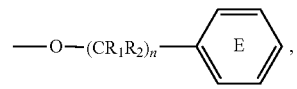

wherein $R_1$ is hydrogen or $C_1$-$C_4$-Alkyl, $R_2$ is hydrogen or $C_1$-$C_4$-Alkyl, n is 0, 1, 2 or 3 and the ring E is unsubstituted or substituted by $C_1$-$C_6$alkyl, $C_1$-$C_6$alkoxy, hydroxy, NHCOR$_3$, NHSO$_2$R$_4$ or SO$_2$NHR$_5$, wherein $R_3$ is $C_1$-$C_4$-Alkyl or phenyl, $R_4$ is $C_1$-$C_4$-Alkyl or phenyl and $R_5$ is is $C_1$-$C_4$-Alkyl or phenyl, b) as a component (B) an alkali soluble oligomer or polymer (reactive or unreactive), c) as a component (C) a polymerizable monomer, d) as a component (D) a photoinitiator, e) as a component (E) an epoxy compound, and also, if desired, f) as a component (F) further additives.

$R_1$, $R_2$, $R_3$, $R_4$ and $R_5$ as $C_1$-$C_4$allyl are each independently of the other methyl, ethyl, propyl, isopropyl, n-butyl, isobutyl, sec-butyl or tert-butyl.

$R_1$ is preferred hydrogen.

$R_2$ is preferred hydrogen.

$R_3$, is preferred methyl and ethyl.

$R_4$ is preferred methyl and ethyl.

$R_5$, is preferred methyl and ethyl.

$C_1$-$C_6$alkyl as substituent of the ring E is for example methyl, ethyl, propyl, isopropyl, n-butyl, isobutyl, sec-butyl, tert-butyl, amyl, tert-amyl (1,1-dimethylpropyl), 1,1,3,3-tetramethylbutyl, hexyl, 1-methylpentyl, neopentyl, cyclopentyl, cyclohexyl, and the associated isomers.

$C_1$-$C_6$alkoxy as substituent of the ring E is for example methoxy, ethoxy, propoxy, isopropoxy, butoxy, sec-butoxy, isobutoxy, tert-butoxy, pentoxy or hexoxy.

n is preferred 1.

Preferred colorants used in the photosensitive resin composition of the present invention are the colorants of formula

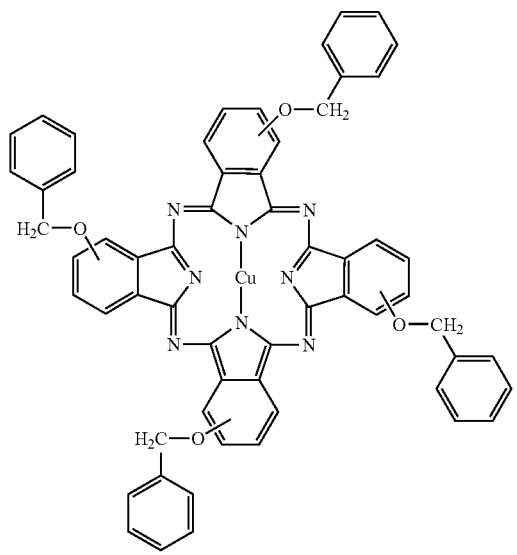

(2)

and

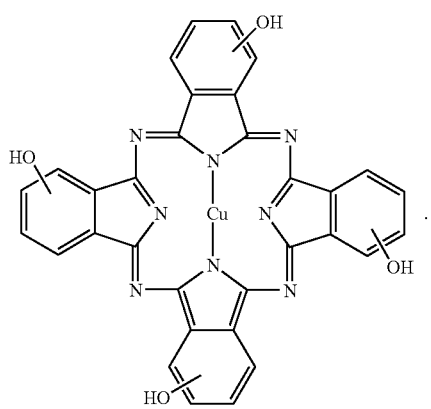

(3)

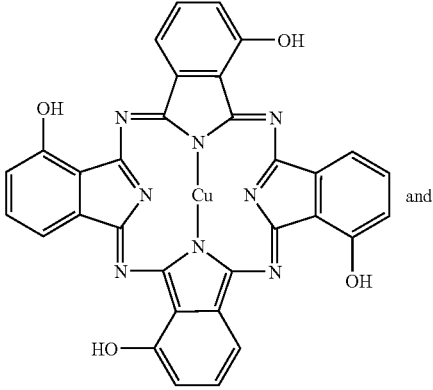

(6)

Particularly preferred colorant used in the photosensitive resin composition of the present invention is the colorant of formula

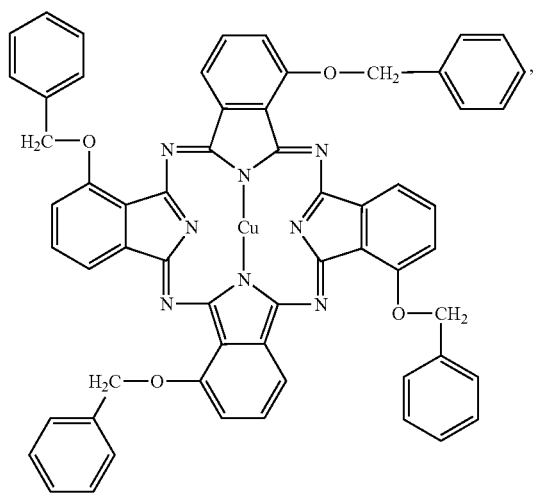

(4)

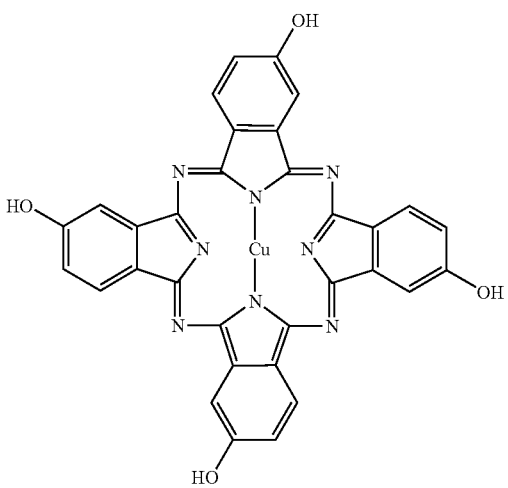

(7)

and

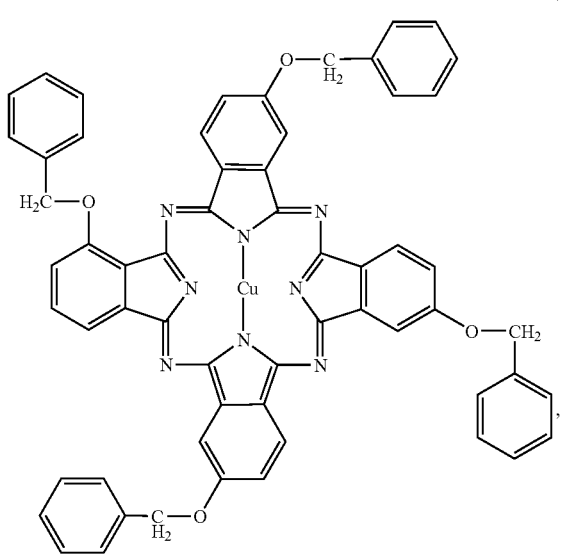

(5)

The colorants of formulae (1) to (7) are known or can be prepared by commonly known methods.

The colorants of formula (1) to (7) can be also used for other resist applications if non-halogen green colorant is required.

Such as for dry film resist used for forming copper circuit pattern of printed circuit board like etching resist and plating resist, and for forming cell or electrode pattern in various flat display panel applications, e.g. forming barrier lib used in a plasma display panel by sand blast method.

Further, the present invention relates to a solder resist process using the inventive photosensitive resin composition, which process comprises the steps of:

(1) mixing the components (A) to (E) and if desired (F) of the inventive composition as given above;
(2) applying the resulting composition to the substrate ("coating of the substrate");
(3) evaporating of the solvent, if present, e.g. at a temperature between 80-90° C., (or the process (1) to (3) can be skipped if dry film type solder resist is used);
(4) exposing the coated substrate to irradiation through a negative mask or by a direct laser imaging (thereby initiating the reaction of the acrylate);
(5) developing the irradiated sample by washing with aqueous alkaline solution and thereby removing the uncured areas; and
(6) thermally curing the sample e.g. at a temperature about 150° C., thereby initiating the crosslinking between the carboxylic acid and the epoxy component.

Thus prepared solder resist layer is a top permanent coating layer of printed circuit board and have to protect inner copper circuit for whole life of the board. Toughest is a soldering process where the solder resist have to be resistant against melt solder temperature (260° C.).

Component (B) is an alkaline soluble binder polymer. The suitable binders are polymers having a molecular weight of about 2'000 to 2'000'000, preferably 10,000 to 500'000, and add value from 50 to 600 mgKOH/g, preferably 100 to 300 mgKOH/g. Examples of alkali developable binders are acrylic polymer having carboxylic acid function as a pendant group, such as conventionally known copolymers obtained by copolymerizing an ethylenic unsaturated carboxylic acid such as (meth)acrylic acid, 2-carboxyethyl (meth)acrylic acid, 2-carboxypropyl (meth)acrylic acid itaconic acid, crotonic acid, maleic acid, half-ester of maleic acid and fumaric add, with one or more monomers selected from esters of (meth)acrylic acid, such as methyl (meth)acrylate, ethyl (meth)acrylate, propyl (meth)-acrylate, butyl (meth)acrylate, benzyl (meth)acrylate, 2-ethylhexyl (meth)acrylate, hydroxyethyl (meth)acrylate, hydroxypropyl (meth)acrylate; vinyl aromatic compounds, such as styrene, -methylstyrene, vinyltoluene, p-chlorostyrene; amide type unsaturated compounds, (meth)acrylamide diacetone acrylamide, N-methylolacrylamide, N-butoxymethacrylamide; and polyolefin type compounds, such as butadiene, isoprene, chloroprene and the like; methacrylonitrile, methyl isopropenyl ketone, vinyl acetate, vinyl propionate, or vinyl pivalate. Examples of copolymers are copolymers of acrylates and methacrylates with acrylic acid or methacrylic acid and with styrene or α-substituted styrene, phenolic resins, for example novolak, (poly)hydroxystyrene, and copolymers of hydroxystyrene with alkyl acrylates, acrylic acid and/or methacrylic acid. Preferable examples of copolymers are copolymers of methyl methacrylate/methacrylic add, copolymers of benzyl methacrylate/methacrylic acid, copolymers of methyl methacrylate/ethyl acrylate/methacrylic acid, copolymers of benzyl methacrylate/methacrylic acid/styrene, copolymers of benzyl methacrylate/methacrylic acid/hydroxyethyl methacrylate, copolymers of methyl methacrylate/butyl methacrylate/ methacrylic acid/styrene, copolymers of methyl methacrylate/benzyl methacrylate/methacrylic acid/hydroxyphenyl methacrylate. The polyimide binder resin in the present invention can be a polyimide precursor, for example, a poly(amic acid).

Other examples of component (B) are polymers or oligomers having at least two ethylenically unsaturated groups and at least one carboxyl function within the molecule structure, such as a resin obtained by the reaction of a saturated or unsaturated polybasic acid anhydride with a product of the reaction of an epoxy compound and an unsaturated monocarboxylic acid (for example, EB9696 from UCB Chemicals; KAYARAD TCR1025 from Nippon Kayaku Co., LTD.; NK OLIGO EA-6340, EA-7440 from Shin-Nakamura Chemical Co., Ltd.), or an addition product formed between a carboxyl group-containing resin and an unsaturated compound having an α,β-unsaturated double bond and an epoxy group (for example, ACA200, ACA200M, ACA210P, ACA230AA, ACA250, ACA300, ACA320 from Daicel Chemical Industries, Ltd.).

Examples of component (C) which are suitable in the compositions according to the invention are photopolymerizable vinyl type monomers. The representative examples are hydroxyalkyl acrylates such as 2-hydroxyethyl acrylate, 2-hydroxybutyl acrylate, etc.; mono- or diacrylates of glycols such as ethylene glycol, methoxytetraethylene glycol, polyethylene glycol, propylene glycol, etc; acrylamides such as N,N-dimethylacrylamide, N-methylolacrylamide, etc.; aminoalkyl acrylates such as N,N-dimethylaminoethyl acrylate, etc.; polyvalent acrylates of polyvalent alcohols or ethylene oxide or propylene oxide adducts thereof such as hexanediol, trimethylolpropane, pentaerythritol, dipentaerythritol, trishydroxyethyl isocyanurate, etc.; phenoxy acrylate, bisphenol A diacrylate and acrylates of ethylene oxide or propylene oxide adducts of these phenols, etc.; acrylates of glycidyl ethers such as glycerin diglycidyl ether, trimethylolpropane triglycidyl ether, triglycidyl isocyanurate, etc.; and melamine acrylate, and/or methacrylates corresponding to the above acrylates, etc.

A mono- or multi-functional ethylenically unsaturated compound, or mixtures of several of said compounds, can be included in the above composition up to 60% by weight based on the solid portion of the composition.

The unsaturated compounds (C) can also be used as a mixture with non-photopolymerizable, film-forming components. These may, for example, be physically drying polymers or solutions thereof in organic solvents, for instance nitrocellulose or cellulose acetobutyrate. They may also, however, be chemically and/or thermally curable (heat-curable) resins, examples being polyisocyanates, polyepoxides and melamine resins, as well as polyimide precursors. The use of heat-curable resins at the same time is important for use in systems known as hybrid systems, which in a first stage are photopolymerized and in a second stage are crosslinked by means of thermal aftertreatment.

Any compound so far known as a photoinitiator can be used as a component (D). The examples of component (C) are camphor quinone, benzophenone, benzophenone derivatives, acetophenone, acetophenone derivatives, for example α-hydroxycloalkyl phenyl ketones or 2-hydroxy-2-methyl-1-phenyl-propanone, dialkoxyacetophenones, α-hydroxy- or α-aminoacetophenones, e.g. (4-methylthiobenzoyl)-1-methyl-1-morpholinoethane, (4-morpholinobenzoyl)-1-benzyl-1-dimethylaminopropane, 4-aroyl-1,3-dioxolanes, benzoin alkyl ethers and benzil ketals, e.g. dimethyl benzil ketal, phenylglyoxalic esters and derivatives thereof, dimeric phenylglyoxalic esters, diacetyl, peresters, e.g. benzophenone tetracarboxylic peresters as described for example in EP-A-1 26 541, monoacyl phosphine oxides, e.g. (2,4,6-trimethylbenzoyl)diphenylphosphine oxide, bisacyiphosphine oxides, bis(2,6-dimethoxy-benzoyl)-(2,4,4-trimethyl-pentyl)phosphine oxide, bis(2,4,6-trimethylbenzoyl)-phenylphosphine oxide, bis(2,4,6-trimethylbenzoyl)-2,4-dipentoxyphenylphosphine oxide, trisacylphosphine oxides, oxime esters, for example 1-phenyl-1,2-propanedione-2-(o-benzoyl) oxime, 1-phenyl-1,2-propanedione-2-(o-ethoxycarbonyl) oxime or other oxime esters described in GB-A-233 9571 and U.S. Pat. No. 2,001,2596, halomethyltriazines, e.g. 2-[2-(4-methoxy-phenyl)-vinyl]4,6-bis-trichloromethyl-[1,3,5]triazine, 2-(4-methoxy-phenyl)4,6-bis-trichloromethyl-[1,3,5] triazine, 2-(3,4-dimethoxy-phenyl)-4,6-bis-trichloromethyl-[1,3,5]triazine, 2-methyl-4,6-bis-trichloromethyl-[1,3,5] triazine, 2-(4N,N-di(ethoxycarbonylmethyl)aminophenyl)-4,6-bis(trichloromethyl)[1,3,5]triazine, 2-(4-methoxy-naphthyl)-4,6-bis-trichloromethyl-[1,3,5]triazine, 2-(1,3-benzodioxol-5-yl)-4,6-bis-trichloromethyl-[1,3,5]triazine, 2-[2-[4 (pentyloxy)phenyl]ethenyl]4,6-bis-trichloromethyl-[1,3,5]triazine, 2-[2-(3-methyl-2-furanyl)ethenyl]4,6-bis-trichloromethyl-[1,3,5]triazine, 2-[2-(5-methyl-2-furanyl) ethenyl]-4,6-bis-trichloromethyl-[1,3,5]triazine, 2-[2-(2,4-dimethoxy-phenyl)-ethenyl]-4,6-bis-trichloromethyl-[1,3,5] triazine, 2-[2-(2-methoxy-phenyl)ethenyl]4,6-bis-trichloromethyl-[1,3,5]triazine, 2-[2-[4 isopropyloxy-phenyl]-ethenyl]4,6-bis-trichloromethyl-[1,3,5]triazine, 2-[2-(3-chloro-4-methoxy-phenyl)ethenyl]-4,6-bis-trichloromethyl-[1,3,5]triazine, 2-[2-bromo-4-N,N-di(ethoxycarbonylmethyl)amino-phenyl]4,6-bis-trichloromethyl-[1,3,5] triazine, 2-[2-chloro-4N,N-di(ethoxycarbonylmethyl) amino-phenyl]4,6-bis-trichloromethyl-[1,3,5]triazine, 2-[3-bromo-4-N,N-di(ethoxycarbonylmethyl)amino-phenyl]-4, 6-bis-tichloromethyl-[1,3,5]triazine, 2-[3-chloro-4-N,N-di (ethoxycarbonylmethyl)amino-phenyl]4,6-bis-trichloromethyl-[1,3,5]triazine, or other halomethyltriazines as described for example in G. Buhr, R. Dammel and C. Undley Polym. Mater. Sci. Eng. 61,269 (1989), and EP-A-262 788; halomethyl-oxazol photoinitiators, such as described in U.S. Pat. No. 4,371,606 and U.S. Pat. No. 4,371, 607; 1,2-disulfones, such as described in E. A. Bartmann, Synthesis 5,490 (1993); hexaarylbisimidazole, and hexaarylbisimidazole/coinitiators systems, e.g. ortho-chlorohexaphenyl-bisimidazole combined with 2-mercaptobenzthlazole, ferrocenium compounds, or titanocenes, e.g. bis(cyclopentadienyl)-bis(2,6-difluoro-3-pyrryl-phenyl)titanium or bisacridine derivates like 1,7-bis(9-acridinyl)heptane.

One of the mentioned photoinitiators, or mixtures of several said compounds, can be included in the above composition up to 20% by weight based on the solid portion of the composition.

To give a subject composition thermosetting property by adding compounds having epoxy groups as component (E). There may be used a solid or liquid known epoxy compound, and said epoxy compound is used depending on required characteristics. For example, when the plating resistance is to be improved, a liquid epoxy resin is used, and when water resistance is required, an epoxy resin having a large number of methyl groups on a benzene ring or a cycloalkyl ring is employed. A preferred epoxy resin, is a bisphenol S type epoxy resin such as BPS-200 produced by Nippon Kayaku Co., Ltd., EPX-30 produced by ACR Co., Epiculon EXA-1514 produced by Dainippon Ink & Chemicals Inc., etc.; a bisphenol A type epoxy resin such as Epiculon N-3050, N-7050, N-9050 produced by Dainippon Ink & Chemicals Inc., XAC-5005, GT-7004, 6484T, 6099 produced by Vantico, etc.; a bisphenol F type epoxy resin such as YDF-2004, YDF2007 produced by Tohto Kasei Co., etc.; a diglycidyl phthalate resin such as Blemmer DGT produced by Nippon Oil and Fats Co., Ltd., etc.; a heterocyclic epoxy resin such as TEPIC produced by Nissan Chemical Industries, Ltd., Araldite PT810 produced by Vantico, etc.; a bixylenol type epoxy resin such as YX4000 produced by Yuka Shell Co., etc.; a biphenol type epoxy resin such as YL-6056 produced by Yuka Shell Co., etc.; a tetra-glycidyl xylenoylethane resin such as ZX-1063 produced by Tohto Kasei Co., etc.; a novolak type epoxy resin such as EPPN-201, EOCN-103, EOCN-1020, EOCN-1025 and BRRN produced by Nippon Kayaku Co., Ltd., ECN-278, ECN-292 and ECN-299 produced by Asahi Chemical Industry Co., Ltd., GY-1180, ECN-1273 and ECN-1299 produced by Vantico, YDCN-220L, YDCN-220HH, YDCN-702, YDCN-704, YDPN-601 and YDPN-602 produced by Tohto Kasei Co., Epiculon-673, N-680, N-695, N-770 and N-775 produced by Dainippon Ink & Chemicals Inc., etc.; a novolak type epoxy resin of bisphenol A such as EPX-8001, EPX-8002, EPPX-8060 and EPPX-8061 produced by Asahi Chemical Industry Co., Ltd., Epiculon N-880 produced by Dainippon Ink & Chemicals Inc., etc.; a chelate type epoxy resin such as EPX-49-69 and EPX49-30 produced by Asahi Denka Kogyo K.K., etc.; a glyoxal type epoxy resin such as YDG414 produced by Tohto Kasei Co., etc.; an amino group-containing epoxy resin such as YH-1402 and ST-110 produced by Tohto Kasei Co., YL-931 and YL-933 produced by Yuka Shell Co., etc.; a rubber-modified epoxy resin such as Epiculon TSR-601 produced by Dainippon Ink & Chemicals Inc., EPX-84-2 and EPX4061 produced by Asahi Denka Kogyo K.K., etc.; a dicyclopentadiene phenolic type epoxy resin such as DCE400 produced by Sanyo-Kokusaku Pulp Co., Ltd., etc.; a silicone-modified epoxy resin such as X-1359 produced by Asahi Denka Kogyo K.K., etc.; an -caprolactone-modified epoxy resin such as Plague G-402 and G-710 produced by Dicel Chemical Industries, Ltd., etc. and others. Further, partially esterified compounds of these epoxy compounds (e.g. esterified by (meth)acrylates) can be used in combination.

It is possible to add photosensitizers or coinitiators to accelerate the photo curing speed as an example of component (F which shift or broaden the spectral sensitivity. These are, in particular, aromatic compounds, for example benzophenone and derivatives thereof, thio-xanthone and derivatives thereof, anthraquinone and derivatives thereof, coumarin and phenothiazine and derivatives thereof, and also 3-(aroylmethylene)thiazolines, rhodanine, camphorquinone, but also eosine, rhodamine, erythrosine, xanthene, thioxanthene, acridine, e.g. 9-phenylacridine, 1,7-bis(9-acridinyl) heptane, 1,5-bis(9-acridinyl)pentane, cyanine and merocyanine dyes.

To accelerate the photopolymerization it is possible to add amines, for example triethanolamine, N-methyldiethanolamine, ethyl-p-dimethylaminobenzoate, 2-(dimethylamino) ethyl benzoate, 2-ethylhexyl-p-dimethylaminobenzoate, octyl-para-N,N-dimethylaminobenzoate, N-(2-hydroxyethyl)-N-methyl-para-toluidine or Michler's ketone. The action of the amines can be intensified by the addition of aromatic ketones of the benzophenone type. Examples of amines which can be used as oxygen scavengers are substituted N,N-dialkylanilines, as are described in EP-A-339 841. Other accelerators, coinitiators and autoxidizers are thiols, thioethers, disulfKdes, phosphonium salts, phosphine oxides or phosphines, as described, for example, in EP-A438 123, in GBA-2 180 358 and in JP Kokai Hei 6-68309.

It is further possible to add chain transfer agents which are customary in the art to the compositions according to the invention as component (E). Examples are mercaptans, amines and benzothiazol.

Further additives known in the art may be added as component (F), as for example flow improvers, adhesion promoters, such as vinyltrimethoxysilane, vinyltriethoxysilane vinyltris(2-methoxyethoxy)silane, N-(2-aminoethyl)-3-aminopropylmethyldimethoxysilane, N-(2-aminoethyl)3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane.

Surfactants, optical brighteners, wetting agents, antiforming agents, levelling assistants, dispersants, aggregation preventers, antioxidants or inorganic fillers are further examples for additives (F).

In order to cure thick and pigmented coatings it is appropriate to add glass microspheres or pulverized glass fibres, as described for example in U.S. Pat. No. 5,013,768.

The composition optionally additionally comprises as component (F) epoxy curing promoters, such as, for example, an amine compound, an imidazole compound, a carboxylic acid, phenol, a quaternary ammonium salt or a methylol group-containing compound.

The choice of additive(s) (F) is made depending on the field of application and on properties required for this field. The additives described above are customary in the art and accordingly are added in amounts which are usual in the respective application.

It is possible to apply micronization (salt-kneading or aqueous milling) for the crude product of the colorants of formula (1) to (7) to achieve higher colour saturation (chroma) and excellent colour strength.

The basic principle of salt-kneading is well-known in the field.

WO-A-00/56819 discloses salt-kneading of a diketopyrrolopyrrole together with a quinacridone pigment, without formation of a solid solution. The advantages are improved milling efficiency, high colour strength and a higher chroma due to less quinacridone.

WO-A-01/04215 discloses a two-step process wherein a pigment or mixture of pigments is first converted into a substantially amorphous fine-particle form, thereafter kneaded together with an organic liquid, Pigment Violet 23 and Pigment Red 254 of improved coloristic properties are obtained.

WO-A-01/09252 discloses salt-kneading of copper-free phthalocyanine pigments in the presence of water-soluble, neutral organic liquids having at least one oxy or oxo group in its molecule.

To achieve improved rheology, dispersibility, and dispersion stability they may also be added known dispersants or rheology improvers, for example sulfonated or Mannich-substituted pigments, in particular such of the phthalocyanine type or colourless ones.

The invention is illustrated by the following Examples. Unless otherwise stated, parts and percentages are by weight and the temperatures are given in degrees Celsius. The relationship between parts by weight and parts by volume is the same as that between the gramme and the cubic centimetre.

EXAMPLE 1

A resist mixture containing
6 g EA-6340 (Phenolnovolak epoxyacrylate with carboxylic acid group from Shin-Nakamura Chemical Co., Ltd.),
0.9 g DPHA (Dipentaerythritol hexaacrylate from Aldrich),
1.5 g GY1180 (Phenolnovolak epoxy from Vantico),
0.3 g IRGACURE907 [(4-methylthiobenzoyl)1-methyl-1-morpholinoethane from Ciba Specialty Chemicals],
0.03 g ®QUANTACURE ITX (4-Isopropylthioxanthone from International Biosynthetics),
0.12 g of the colorant of formula

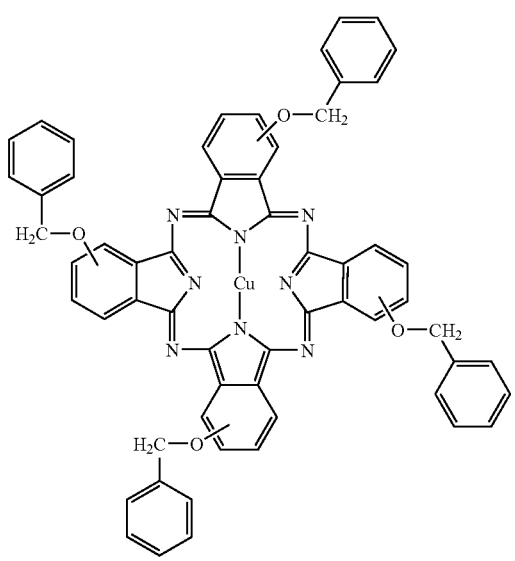

(2)

and
1.6 g Acetone
is dispersed by SKANDEX DISPERSER (BA-520) with 20 g of 3 mm glass beads for 2 hours. The dispersion liquid is applied onto an aluminum substrate and dried for 15 min. at 80° C. The thickness of the resist after drying is 20 micron. The resist is exposed for 300 ml/sqcm through acetate film, photo-mask and vacuum foil by metal halide lamp (SMX-3000 from ORC mfg.). After development with splaying 1% aqueous $Na_2CO_3$ solution (30° C.) for 100 sec. the resist is thermally cured at 150° C. for 1 hour. To mimic the soldering process, the thermally cured resist is coated with flux (H-10F) and heated at 260° C. for 5 min. in a drying oven. The appearance of the resist before and after thermal treatment (260° C. for 5 min.) are compared.

EXAMPLE 2

Sample preparation and evaluation are done in the same way as Example 1 except the colorant of formula (2) is replaced with same amount by weight of the colorant of formula

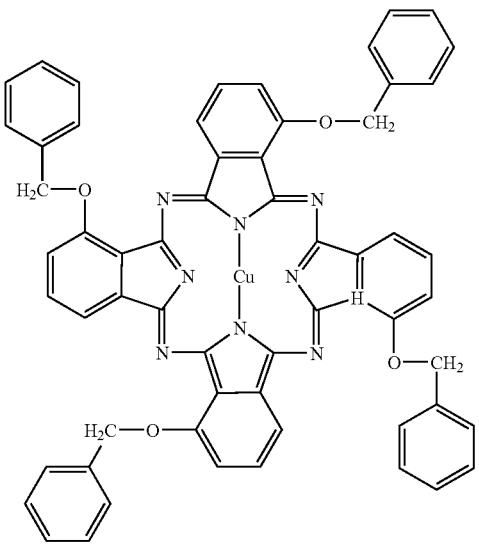

EXAMPLE 3

Sample preparation and evaluation are done in the same way as Example 1 except the colorant of formula (2) is replaced with same amount by weight of the colorant of formula

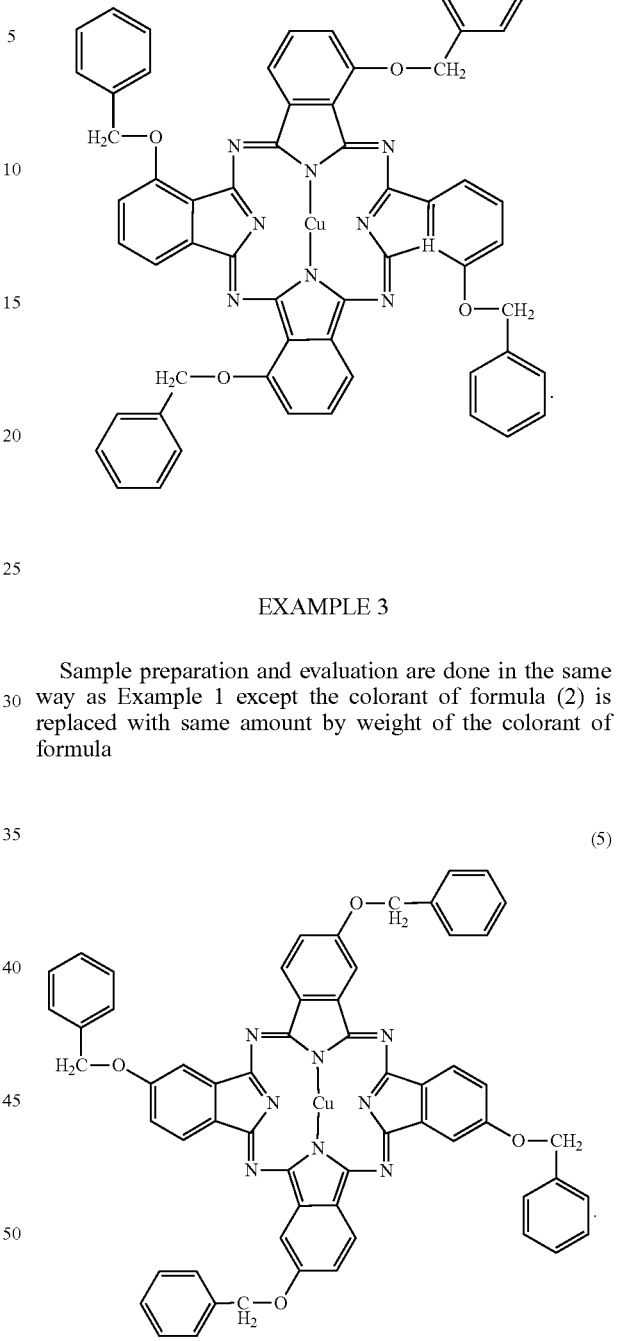

(5)

EXAMPLE 4

A resist mixture containing
6 g EA-6340 (Phenolnovolak epoxyacrylate with carboxylic acid group from Shin-Nakamura Chemical Co., Ltd.),
0.9 g DPHA (Dipentaerythritol hexaacrylate from Aldrich),
1.5 g GY1180 (Phenolnovolak epoxy from Vantico),
0.3 g IRGACURE907 [(4-methylthiobenzoyl)-1-methyl-1-morpholinoethane from Ciba Specialty Chemicals], 0.03 g ®QUANTACURE ITX (4-Isopropylthioxanthone from International Biosynthetics), 0.12 g of the colorant of formula

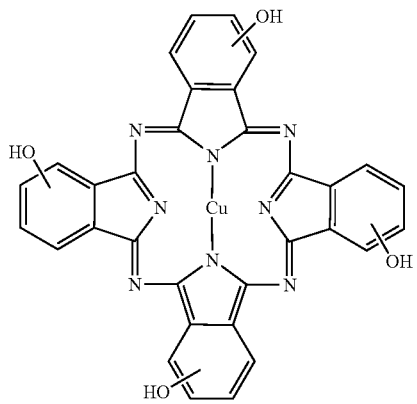

(3)

and 1.6 g Acetone is dispersed by SKANDEX DISPERSER (BA-S20) with 20 g of 3 mm glass beads for 2 hours. The dispersion liquid is applied onto an aluminum substrate and dried for 15 min. at 80° C. The thickness of the resist after drying is 20 micron. The resist is exposed for 300 mJ/sqcm through acetate film, photo-mask and vacuum foil by metal halide lamp (SMX-3000 from ORC mfg.). After development with splaying 1% aqueous $Na_2CO_3$ solution (30° C.) for 100 sec. the resist is thermally cured at 150° C. for 1 hour. To mimic the soldering process, the thermally cured resist is coated with flux (H-10F) and heated at 260° C. for 5 min. in a drying oven. The appearance of the resist before and after thermal treatment (260° C. for 5 min.) are compared.

EXAMPLE 5

Sample preparation and evaluation are done in the same way as Example 4 except the colorant of formula (3) is replaced with same amount by weight of the colorant of formula

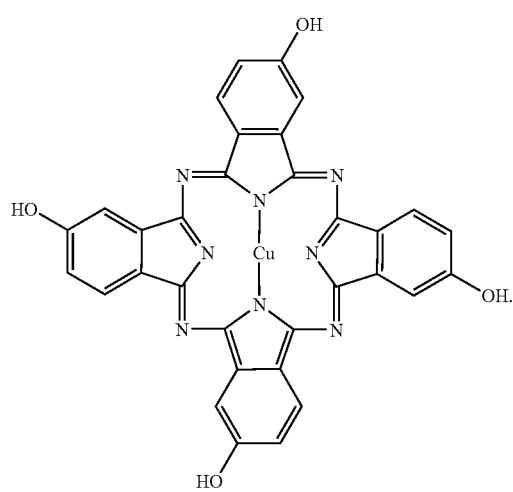

(7)

EXAMPLE 6

Sample preparation and evaluation are done in the same way as Example 4 except the colorant of formula (3) is replaced with same amount by weight of the colorant of formula

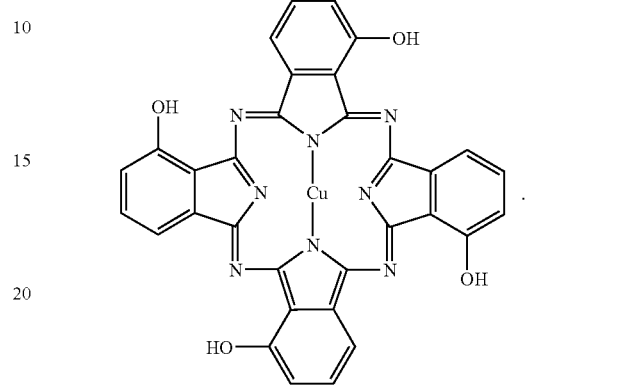

(6)

REFERENTIAL EXAMPLE

Sample preparation and evaluation are done in the same way as Example 1 except the colorant of formula (2) is replaced with the same amount by weight of Pigment Green 7 (IRGALITE Green GFNP from Ciba Specialty Chemicals).

Results

|  | Appearance of the coating after thermal treatment (260° C. for 5 min.) | Halogen content in the formed resist[#1] |
|---|---|---|
| Example 1 | No change | No |
| Example 2 | No change | No |
| Example 3 | No change | No |
| Example 4 | No change | No |
| Example 5 | No change | No |
| Example 6 | No change | No |
| Referential Example | No change | Yes |

[#1]Estimation from the chemical structure of each resist ingredients.

What is claimed is:

1. A photosensitive resin composition comprising as a component (A) a halogen-free green colorant of the formula

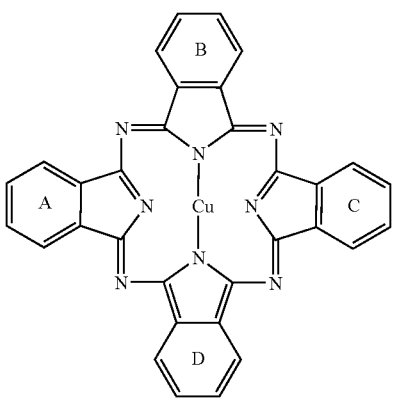

(I)

in which the rings A, B, C and D are substituted by the moiety

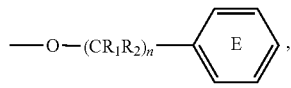, wherein $R_1$ is hydrogen or $C_1$-$C_4$-Alkyl, $R_2$ is hydrogen or $C_1$-$C_4$-Alkyl, n is 0, 1, 2 or 3 and the ring E is unsubstituted or substituted by $C_1$-$C_6$alkyl, $C_1$-$C_6$alkoxy, hydroxy, $NHCOR_3$, $NHSO_2R_4$ or $SO_2NHR_5$, wherein $R_3$ is $C_1$-$C_4$-Alkyl or phenyl, $R_4$ is $C_1$-$C_4$-Alkyl or phenyl and $R_5$ is $C_1$-$C_4$-Alkyl or phenyl, b) as a component (B) an alkali soluble reactive or unreactive oligomer or reactive or unreactive polymer, c) as a component (C) a polymerizable monomer, d) as a component (D) a photoinitiator, e) as a component (E) an epoxy compound, and also, if desired, f) as a component (F) further additives.

2. A photosensitive resin composition according to claim 1, wherein the component (A) is the colorant of formula

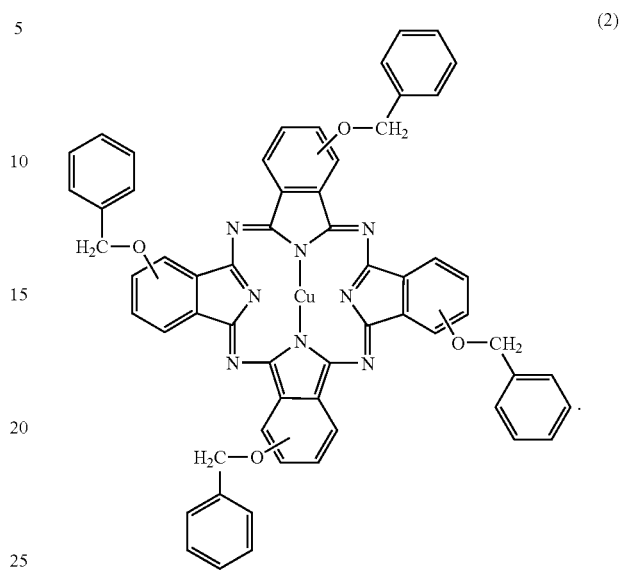

3. Substrate coated with the photosensitive resin composition according to claim 2.

4. Substrate coated with the photosensitive resin composition according to claim 1.

5. A photosensitive resin according to claim 1, wherein the polymerizable monomer is a vinyl monomer.

* * * * *